US006898767B2

(12) United States Patent
Halstead

(10) Patent No.: US 6,898,767 B2
(45) Date of Patent: May 24, 2005

(54) METHOD AND APPARATUS FOR CUSTOM DESIGN IN A STANDARD CELL DESIGN ENVIRONMENT

(75) Inventor: Duncan Halstead, Denver, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/144,101

(22) Filed: May 9, 2002

(65) Prior Publication Data

US 2003/0212967 A1 Nov. 13, 2003

(51) Int. Cl.[7] .............................................. G06F 17/50
(52) U.S. Cl. .............................. 716/3; 703/14; 716/6; 716/18
(58) Field of Search ............................ 703/14; 716/3, 716/6, 18, 2, 4, 5

(56) References Cited

U.S. PATENT DOCUMENTS 5,222,030 A1 * 10/2002 Rostoker et al. ............... 716/6
6,470,482 B1 * 10/2002 Rostoker et al. ............... 716/6

* cited by examiner

Primary Examiner—Vuthe Siek
Assistant Examiner—Thuan Do
(74) Attorney, Agent, or Firm—The Law Offices of William W. Cochran, LLC

(57) ABSTRACT

Disclosed is a method for converting a SPICE format circuit description to a standard cell HDL netlist, such as Verilog, allowing simulation and verification in HDL format. SPICE elements may be converted to circuit functions and corresponding standard cells are then selected. The SPICE netlist is employed to define timing paths. Timing information from SPICE simulation is correlated with timing characteristics of the standard cells and a standard delay file is produced such that, when applied to the standard cells, timing approximates that of the SPICE simulation. The present invention may also employ SPICE to Verilog conversion wherein a SPICE netlist is converted to a Verilog standard cell netlist. Timing information from SPICE simulation is correlated with timing characteristics of the standard cells in the Verilog netlist and a standard delay file is produced such that, when applied to the standard cells, timing approximates that of SPICE simulations.

31 Claims, 5 Drawing Sheets

METHOD AND APPARATUS FOR CUSTOM DESIGN IN A STANDARD CELL DESIGN ENVIRONMENT

BACKGROUND OF THE INVENTION a. Field of the Invention

The present invention pertains to integrated circuit development and more specifically to employing standard cell tools in the simulation and verification of custom circuit designs.

b. Description of the Background

Integrated circuit designs may employ custom, semi-custom, or a combination of custom and semi-custom design methodologies. Custom refers to the creation of a new physical layout for each design. Semi-custom refers to the use of predefined circuit elements. Semi-custom methodologies include gate array and standard cell. Gate arrays employ a set of predefined functions fabricated on a semiconductor wafer that may be later interconnected to implement a design. Standard cell technologies provide a library of low-level circuit functions each having a predefined physical layout. The predefined physical layout, or cells, typically have a common dimension such as width or height such that they may be placed in rows and blocks, the order determined by functions to be implemented and routing of interconnect between cells or groups of cells.

In developing an integrated circuit, a designer may partition a design into various functional blocks and then design circuitry for each functional block or re-use a design for a functional block if a previous design meets size, power, and performance criteria. Circuit design most frequently employs a hardware descriptive language (HDL) that specifies circuit elements and the connection between elements. Verilog® is a commonly used HDL and is the topic of IEEE Std 1364. Verilog is a registered trademark of Cadence Design Systems, headquartered in San Jose, Calif. Verilog may be used to specify the initial design, to provide input to simulation and synthesis tools, and to check post layout operation.

At times, the predefined set of cells of a standard cell library may not provide a desired function, or may not provide the speed, size, or power consumption desired. In these circumstances, new cells may be created, or a custom block of logic incorporating the desired function and capabilities may be designed. The design of the custom block of logic may employ SPICE (Special Programs for Interactive Circuit Elements) to specify and simulate the design. Some product versions of SPICE support both logical and timing simulation. However, SPICE simulation is extremely slow when compared to simulation employing an HDL netlist, such as a Verilog, as is commonly employed for standard cell designs. When designs comprise standard cell and custom logic sections, a problem arises when attempting to simulate the entire design. The custom logic may exist simply as a "black box" wherein operation of standard cell and custom logic are separately simulated but simulation comprising both sections is not performed. A behavioral model, such as may be written in a programming language such as "C", for example, may be employed for functional simulation, but such models do not allow timing analysis. Due to the limitations of present methods, a new method is needed that allows simulation of both standard cell and analog circuits with timing analysis without requiring extensive simulation time or computing resources.

SUMMARY OF THE INVENTION

The present invention overcomes the disadvantages and limitations of the prior art by providing a system and method of converting a SPICE netlist to standard cell circuit elements and annotating simulation models with timing information from SPICE simulations. Advantageously, the present invention allows the converted SPICE based designs to be simulated much more rapidly and further allows both logical verification and timing simulation.

The present invention therefore may comprise a method of converting a SPICE netlist to a standard cell netlist comprising: converting the SPICE netlist to logic functions, selecting standard cells that correspond to the logic functions to produce a standard cell netlist, extracting timing paths from the SPICE netlist, simulating the SPICE netlist, extracting timing information from the SPICE simulation, and creating a standard delay file that reflects the timing information such that when applied to the standard cells, standard cell timing approximates that of the SPICE simulation.

The present invention allows conversion of SPICE designs to standard cell code, such as a gate level netlist, or to HDL code that is behavioral in nature, providing flexibility in the format of verification and simulation. The standard cell code or HDL code may be Verilog, VHDL, or other HDL language. VHDL is an acronym which stands for VHSIC Hardware Description Language. VHSIC is another acronym which stands for Very High Speed Integrated Circuits. VHDL is a standard (VHDL-1076) developed by the IEEE (Institute of Electrical and Electronics Engineers). Verification allows the designer to confirm that a logic design operates in a manner consistent with design specifications and may employ logical or formal equivalence testing. Simulation may be employed to confirm that the timing of circuitry. Verification and simulation further be employed for test program generation and fault coverage analysis. Advantageously, a SPICE file that is converted to Verilog or other HDL may be used as stimulus to another block that is being designed, allowing design and simulation to occur in a single format. The circuit and signal names of the SPICE file may be retained, or may be translated to a form readily associable with the original names such that translated files may easily be compared with the SPICE source file. The hierarchy of the SPICE description may also be maintained, allowing simplified review of circuit structure. The present invention may employ SPICE to Verilog or other HDL conversion.

The invention therefore may further comprise a method of converting a SPICE netlist to a standard cell netlist comprising: converting the SPICE netlist to an HDL netlist, synthesizing the HDL netlist to produce a standard cell netlist, extracting timing paths from the SPICE netlist, simulating the SPICE netlist, extracting timing information from the SPICE simulation, and creating a standard delay file that reflects the timing information such that when applied to the standard cells, standard cell timing approximates that of the SPICE simulation.

The present invention provides the flexibility of custom design in SPICE plus conversion to a format that allows developers to employ a wider range of simulation and verification tools while improving speed of simulation and verification, generation of test programs, and determination or estimation of fault coverage. The method of the present invention may be employed in a batch process, providing automated conversion. The aforementioned flexibility of format may allow greater utilization of resources by providing a choice to simulate using SPICE to confirm custom logic operation and simulate designs comprising standard cell and custom logic using Verilog or other HDL languages. The method of the present invention may be realized on computing equipment and resources common to integrated circuit design.

The present invention may therefore further yet comprise a system for converting a SPICE netlist to a standard cell netlist comprising: a computer, a first program that converts the SPICE netlist to logic functions, a second program that selects standard cells corresponding to the logic functions, a third program that correlates SPICE simulation timing information with signal paths of the standard cells and creates a standard delay file such that when applied to the standard cells, timing of the standard cells more closely reflects that of the SPICE simulation.

The present invention allows greatly increased speed of simulation, enabling designers to perform "what if" simulations where different logical and physical designs may be more quickly evaluated to determine viability. The increased speed of simulation, verification of logic and timing, and improved test program generation/fault may reduce the development costs of integrated circuits comprising standard cell and custom logic sections. The invention also allows for more thorough verification to be performed.

The present invention may therefore additionally comprise an integrated circuit produced by the steps of: partitioning a design into a plurality of function blocks, designing a first one of the plurality of function blocks employing an HDL to produce an HDL netlist, synthesizing the HDL netlist to produce a first standard cell netlist, designing a second one of the plurality of function blocks employing SPICE to produce a SPICE netlist, simulating the SPICE netlist, converting the SPICE netlist to logic functions, selecting standard cells that correspond to the logic functions to produce a second standard cell netlist, extracting timing paths from the SPICE netlist, extracting timing information from the SPICE simulation, and creating a standard delay file that reflects the timing information such that, when applied to the standard cells in the second standard cell netlist, standard cell timing approximates that of the SPICE simulation.

DESCRIPTION OF THE FIGURES In the Figures.

DETAILED DESCRIPTION OF THE INVENTION

Figure 1:
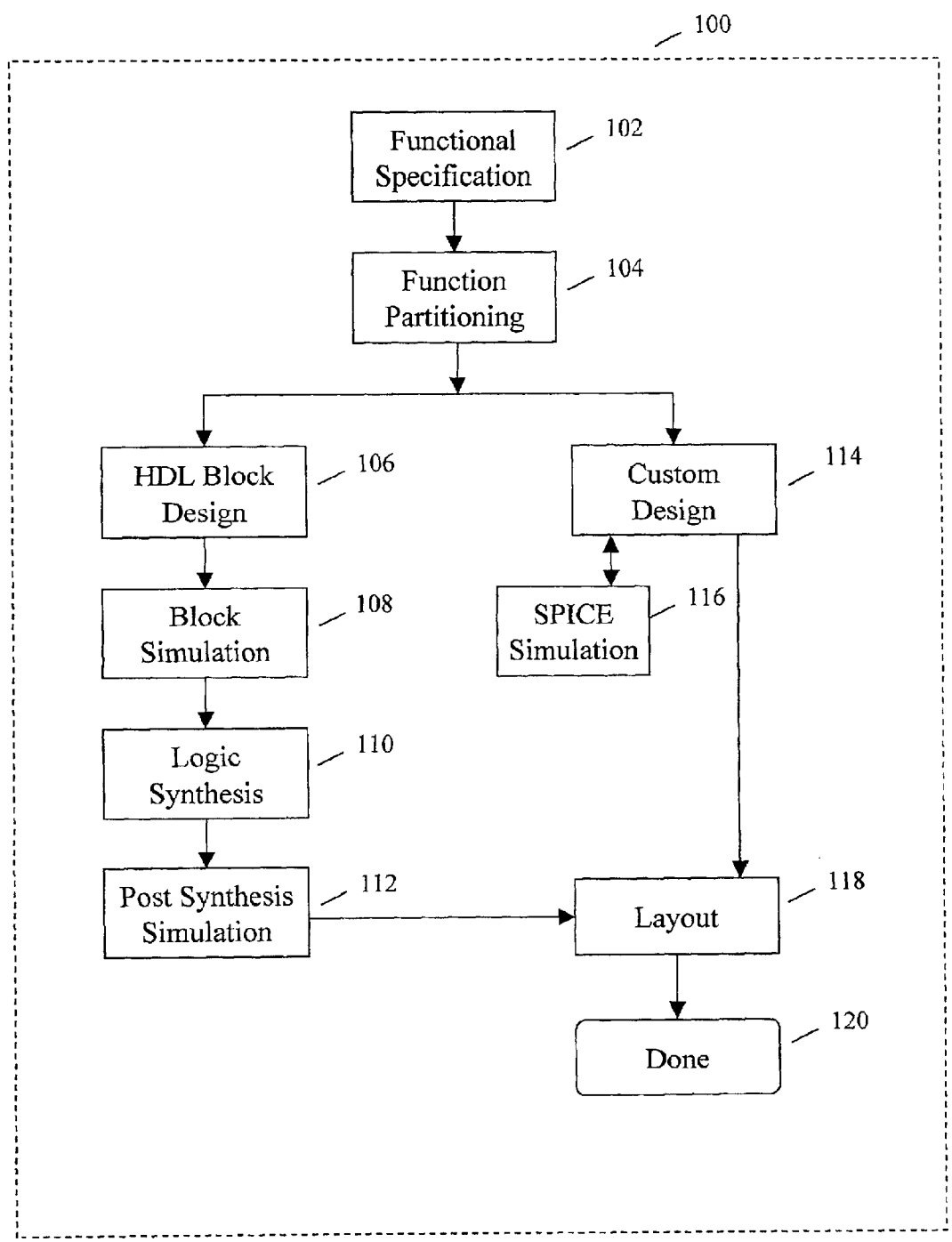
FIG. 1 depicts a first method for design of an integrated circuit comprising custom and semi-custom sections.

FIG. 1 depicts a first method for design of an integrated circuit comprising custom and semi-custom sections. Method 100 begins at step 102 where a functional specification for a design is received. At step 104, the design may be partitioned into functional blocks. Such partitioning may also include partitioning of the design into standard cell and custom design sections. A standard cell process begins at step 106 and a custom design process begins at step 114. At step 106, logic design of the standard cell sections partitioned in step 104 is performed. Logic design may comprise register transfer level (RTL) specification of the block employing a hardware descriptive language such as Verilog. Verilog is a Hardware Description Language (HDL); and is a textual format for describing electronic circuits and systems. Applied to electronic design, Verilog may be used for verification through simulation, for timing analysis, for test analysis (testability analysis and fault grading) and for logic synthesis. Through Verilog, the designer may select circuit elements and define the interconnection between elements. At step 108, blocks designed in step 106 are simulated and results are checked. If design criteria are met, processing continues at step 110. If the simulation criteria of step 108 are not met, the process may continue at step 106 where blocks are redesigned, or processing may continue at step 114 where custom design is employed. At step 110, logic synthesis is performed on the netlist meeting the simulation criteria of step 108. Synthesis includes selection of standard cells from a standard cell library to implement the logic defined in the HDL netlist. At step 112, the synthesized design is simulated and results are checked. If simulation criteria are met, the process then continues at step 118. If criteria are not met, the process may continue at step 106 where redesign is performed, or the process may continue at step 110 where synthesis parameters may be changed, or the process may continue at step 114 where custom logic may be designed. At step 114, blocks partitioned in step 104, or blocks not meeting the simulation criteria of step 108 or step 112 are custom designed. Custom design typically comprises the physical layout and sizing of circuit elements including transistors, metal and polysilicon interconnect, and may include resistors, and capacitors. At step 116 a SPICE representation of the physical design is created and simulated and results are checked. SPICE simulation tools may provide timing analysis and logical simulation. If the custom design does not meets criteria, the process may continue at step 114. If the custom design meets criteria, the process continues at step 118. At step 118, place and route software is employed to position the custom design layout and standard cells and to route signal lines between and among standard cells and the custom layout. The method of FIG. 1 may be termed a 'black box' method in that, due to the slow speed of SPICE simulation, operation of the custom and standard cell sections is not simulated together. Successful operation of integrated circuit depends on careful specification of the custom and standard cell interface.

Figure 2:
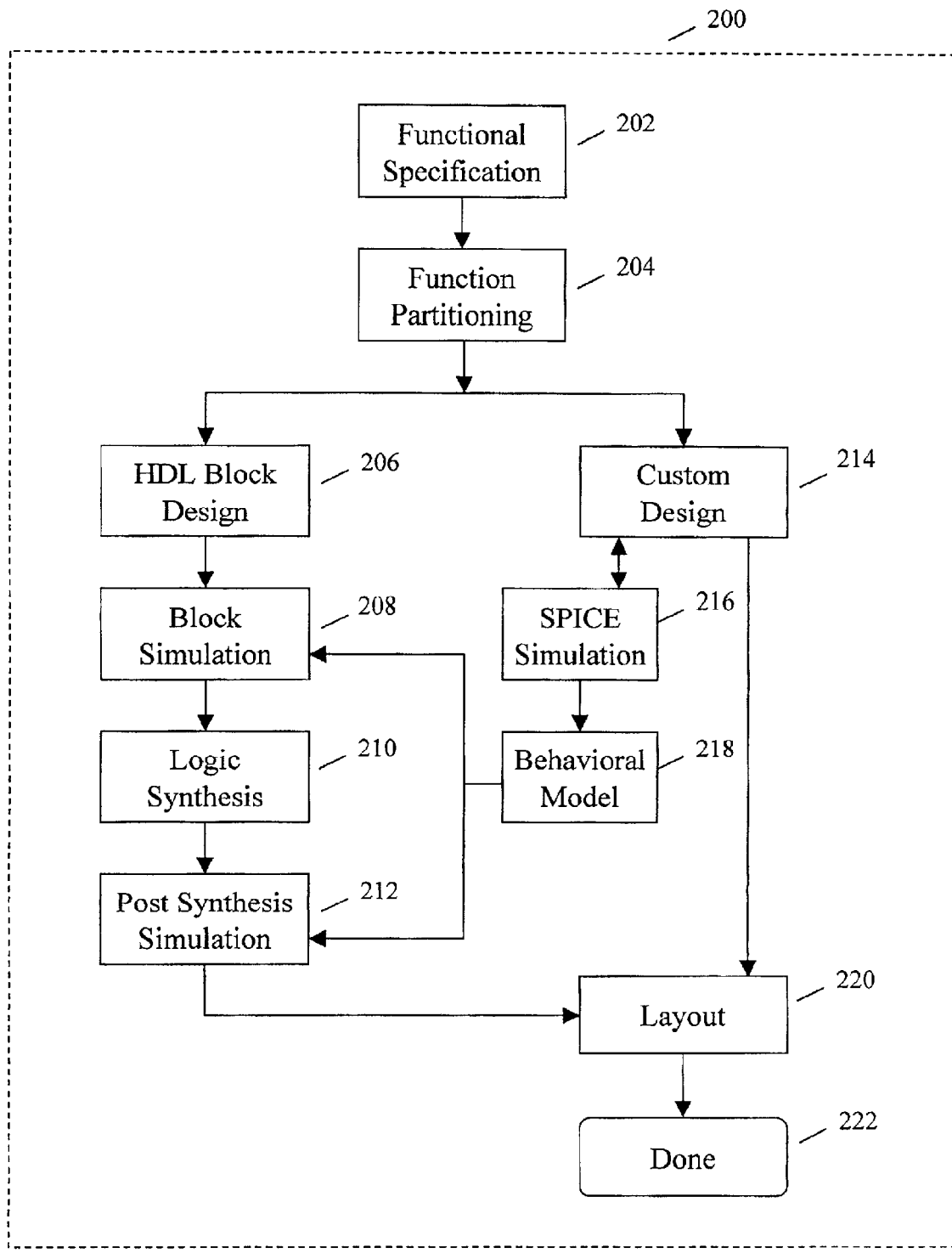
FIG. 2 depicts a design method utilizing a behavioral model.

FIG. 2 depicts a design method utilizing a behavioral model. The method of figure is like FIG. 1 with the exception that following SPICE simulation of step 216, a behavioral model is created at step 218. The behavioral model is a representation of the custom circuitry, usually written in a high level language, which may be used to verify logical operation. The behavioral model may be used in conjunction with step 208, allowing logical simulation of standard cell and custom sections. The behavioral model may also be used for logic verification of the post synthesis design. While behavioral models allow logic verification of the operation of standard cell and custom sections together, the models are not suited to timing analysis and fault grading, since the model does not contain device (i.e. transistors and logic gates comprised thereof) descriptions or timing information.

Figure 3:
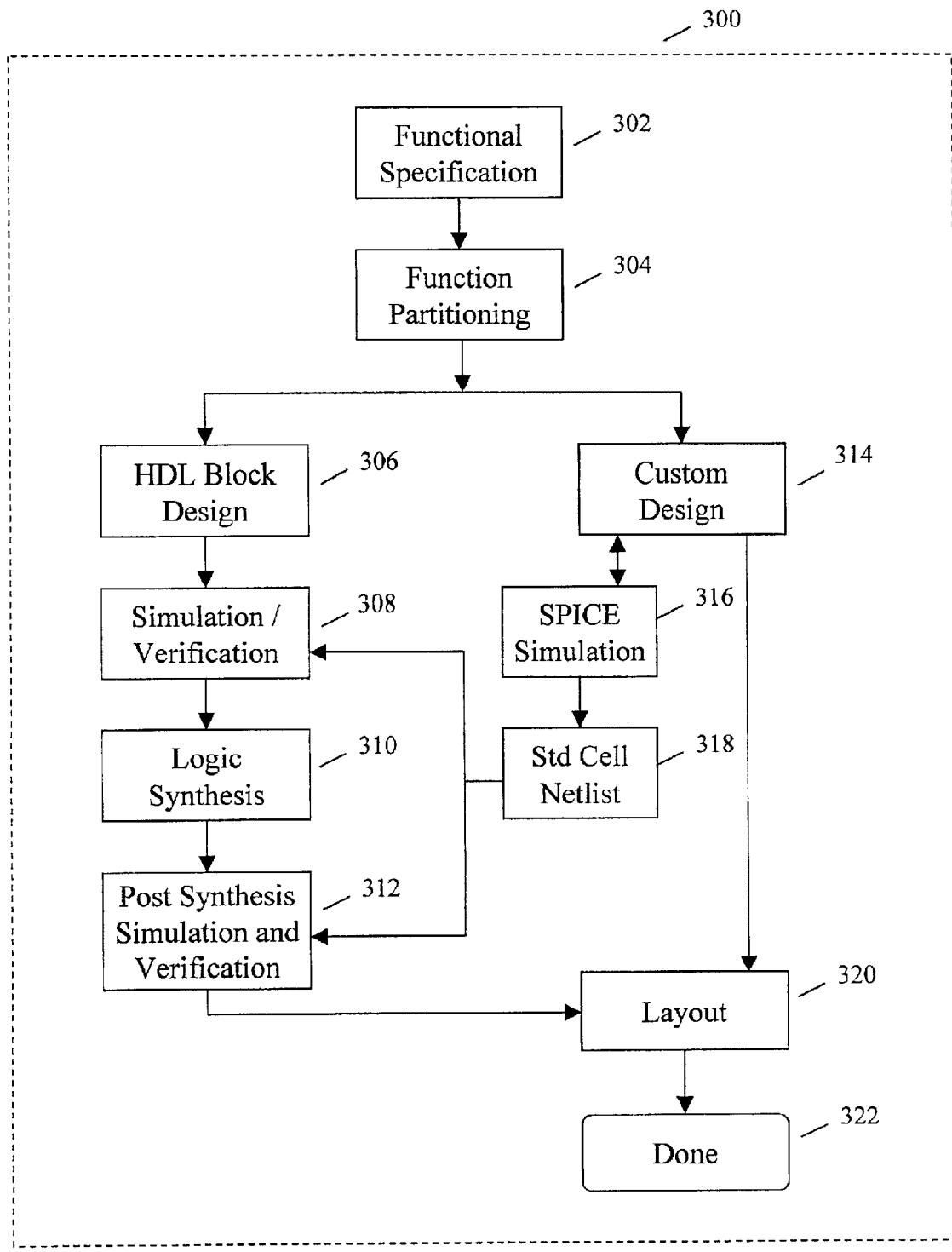
FIG. 3 depicts a method of the present invention.

FIG. 3 depicts a method of the present invention. Method 300 begins at step 302 where a functional specification for a design is received. At step 304, the design may be partitioned into functional blocks. Such partitioning may also include partitioning of the design into standard cell and custom design sections. A standard cell process begins at step 306 and a custom design process begins at step 314. At step 306, logic design of the standard cell sections partitioned in step 304 is performed. At step 308, blocks designed in step 306 are simulated, verification performed, and results checked. Verification at step 308 may comprise a suite of test vectors. The simulation and verification of step 308 may employ information from standard cell netlist 318, as shall be described later. If design criteria are met, processing continues at step 310. If the simulation criteria of step 308 are not met, the process may continue at step 306 where blocks may be redesigned, or processing may continue at step 314 where custom design is employed. At step 310, the HDL netlist is synthesized. Synthesis includes selection of standard cells from a standard cell library to implement the logic defined in the HDL netlist. At step 312, the synthesized design is simulated, verification performed, and results are checked. The simulation and verification of step 312 may employ information from standard cell netlist 318, as shall be described later. Verification may comprise formal verification wherein an exhaustive Boolean proof is performed. If simulation and verification criteria are met, the process then continues at step 320. If criteria are not met, the process may continue at step 306 where redesign is performed, or the process may continue at step 310 where synthesis parameters may be changed, or the process may continue at step 314 where custom logic may be designed. At step 314, blocks partitioned in step 304, or blocks not meeting the simulation criteria of step 308 or step 312 are custom designed. At step 316 a SPICE representation of the physical design is created and simulated and results are checked. If the custom design does not meets criteria, the process may continue at step 314. If the custom design meets criteria, the process continues at step 318. At step 318, the SPICE netlist is converted to a standard cell netlist. Logical information may be provided to step 308 for logic verification. Logical and timing information may be provided to step 312 to confirm timing. Creation of a standard cell netlist from SPICE is described in greater detail in FIG. 4. Advantageously, the method of FIG. 3 allows for logical verification of the whole integrated circuit, not just the standard cell section. This also may provide improved fault coverage and may simplify test generation. The availability of timing information for the custom logic, as may be employed for post synthesis simulation, allows timing margins to be more easily and automatically determined, further allowing optimization of designs and layout.

Figure 4:
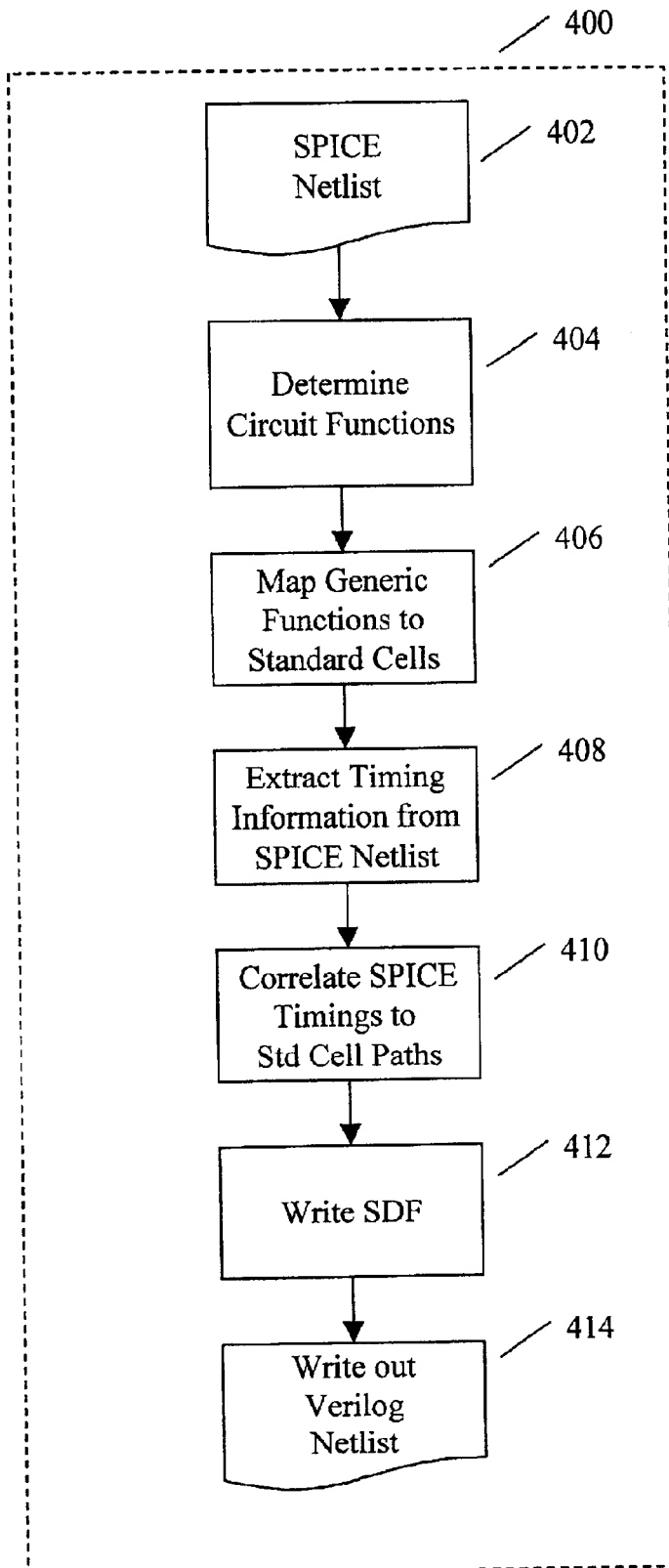
FIG. 4 depicts a method for converting SPICE to a standard cell netlist.

FIG. 4 depicts a method for converting SPICE to a standard cell netlist. At step 402, a SPICE netlist is accessed. At step 404, the logic functions of the SPICE netlist are determined. At step 406 the logic functions are mapped to logic functions of the standard cell library. At step 408, timing paths are extracted from the SPICE netlist. Timing paths may include input and output signals to each logic function. At step 410, timing from simulation of the SPICE netlist is correlated with signal paths of the standard cells mapped in step 406. At step 412, timing values reflecting the SPICE simulation are determined for each standard cell and a file of these values, termed a standard delay file (SDF) is produced. Standard delay files are well known in the semiconductor industry and may conform to IEEE standard P1497. At step 414, an HDL netlist comprising the standard cells mapped in step 406 is written.

Figure 5:
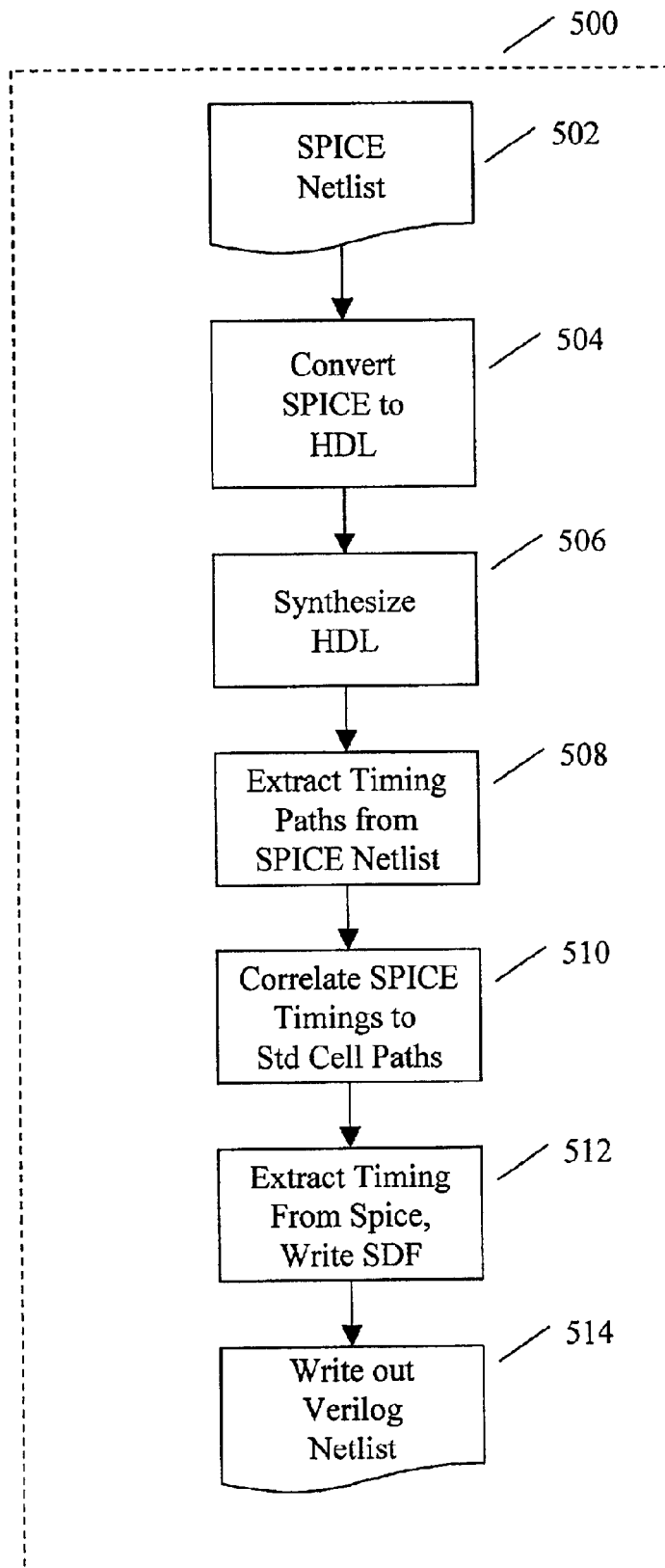
FIG. 5 depicts another method for converting SPICE to a standard cell netlist.

FIG. 5 depicts another method for converting SPICE to a standard cell netlist. At step 502, a SPICE netlist is accessed. At step 504, the SPICE is converted to an HDL netlist such as Verilog. Such conversion may employ methods as described in U.S. patent application Ser. No. 09/972,100 entitled "Spice to Verilog Netlist Translator" filed Oct. 5, 2001 by Andrew Rankin which is specifically incorporated herein for all that it discloses and teaches. At step 506, the HDL netlist created in step 504 is synthesized, implementing the logic defined in the HDL netlist in standard cells. At step 508, timing paths are extracted from the SPICE netlist. Timing paths may include input and output signals to each logic function. At step 510, timing from simulation of the SPICE netlist is correlated with the signals paths of the standard cells selected in the synthesis of step 506. At step 512, timing values reflecting the SPICE simulation are determined for each standard cell and a file of these values, termed a standard delay file (SDF) is produced. At step 514, an HDL netlist comprising the standard cells mapped in step 506 is written.

The determination of logic functions contained in a SPICE netlist, corresponding to step 404 of FIG. 4, may employ LVS (Layout vs. Schematic Verifier) tools to extract the logic functions from the custom logic layout SPICE file. LVS tools are available from a number of vendors including Cadence Corporation of San Jose Calif. A SPICE netlist may have a hierarchy of circuit and sub-circuit functions. Sub-circuit functions may be defined as a set of inputs and outputs and interconnected transistors, with model definitions for each transistor. Sub-circuit names may be defined such that it may be easily associated with a corresponding function in a standard cell library, thereby simplifying the conversion process. For example, table 1 below shows SPICE for an AND gate. The conversion process may parse the word "AND" from the sub-circuit name to select a standard cell providing the AND function. SPICE simulation information may be employed to select one of a plurality of AND gates contained in a standard cell library with characteristics that reflect the simulation.

TABLE 1

EXAMPLE SPICE DATA

.SUBCKT AND2AFP_ZZ Z A B VDDL VSSL
* devices:
m_MP02 ZB A VDDL VDDL pm_hp l=0.18u w=2.415u ad=0.5423p as=1.531p pd=0.5195u + ps=3.6u
m_MP01 ZB B VDDL VDDL pm_hp l=0.18u w=2.396u ad=0.5381p as=1.055p pd=0.5155u + ps=1.043u
m_MP03 Z ZB VDDL VDDL pm_hp l=0.18u w=3.495u ad=1.345p as=1.538p pd=4.32u + ps=1.522u
m_MN01 ZB A N1N6 VSSL nm_hp l=0.18u w=1.695u as=0.3442p ad=1.061p ps=0.405u + pd=2.97u
m_MN02 N1N6 B VSSL VSSL nm_hp l=0.18u w=1.695u as=0.626p ad=0.3442p ps=0.8717u + pd=0.405u
m_MN03 Z VSSL VSSL nm_hp l=0.18u w=2.505u as=0.9252p ad=1.316p ps=1.288u + pd=3.6u
* lumped capacitances:
cp1 VDDL VSSL 0.6033f
cp2 ZB VSSL 1.36f
cp3 VSSL VSSL 0.5806f
cp4 Z VSSL 0.1816f
cp5 B VSSL 1.09f
cp6 A VSSL 0.8065f
.ENDS AND2AFP_ZZ
.ENDS In summary, the present invention provides a convenient and flexible method to incorporate custom designs in a standard cell design environment. Speed and thoroughness of simulation and verification, verification of timing and logic, and improved test generation and fault coverage provide an opportunity for reduced development cycle time, reduce development costs and reduced time to market.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

I claim:

1. A method of converting a SPICE netlist to a standard cell netlist comprising:

converting said SPICE netlist to logic functions;

selecting standard cells that correspond to said logic functions to produce a standard cell netlist;

extracting timing paths from said SPICE netlist;

simulating said SPICE netlist;

extracting timing information from the SPICE simulation; and creating a standard delay file using said timing information such that when said delay file is applied to said standard cells, standard cell timing reflects said timing information from said SPICE simulation.

2. The method of claim 1 wherein said step of converting further comprises:

employing an LVS tool.

3. The method of claim 1 wherein said step of converting further comprises:

associating SPICE sub-circuit names with standard cell names.

4. The method of claim 1 further comprising:

saving a file comprising said standard cell netlist.

5. A method of converting a SPICE netlist to a standard cell netlist comprising:

converting said SPICE netlist to an HDL netlist;

synthesizing said HDL netlist to produce a standard cell netlist;

extracting timing paths from said SPICE netlist;

simulating said SPICE netlist;

extracting timing information from the SPICE simulation; and creating a standard delay file using said timing information such that when said delay file is applied to said standard cells, standard cell timing reflects said timing information from said SPICE simulation.

6. The method of claim 5 further comprising:

saving a file comprising said standard cell netlist.

7. The method of claim 5 wherein said HDL netlist is a Verilog netlist.

8. A method of designing an integrated circuit containing standard cell and custom logic comprising:

designing a first portion of said integrated circuit using HDL to produce an HDL netlist;

designing a second portion of said integrated circuit using SPICE to produce a SPICE netlist;

synthesizing said HDL netlist to produce a first standard cell netlist;

converting said SPICE netlist to logic functions;

selecting standard cells that correspond to said logic functions to produce a second standard cell netlist;

extracting timing paths from said SPICE netlist;

simulating said SPICE netlist;

extracting timing information from the SPICE simulation; and creating a standard delay file using said timing information such that when said delay file is applied to said standard cells in said second standard cell netlist, standard cell timing reflects said timing information from said SPICE simulation.

9. The method of claim 8 wherein said HDL is Verilog.

10. The method of claim 8 further comprising:

simulating said first standard cell netlist and said second standard cell netlist.

11. The method of claim 8 further comprising:

extracting fault coverage information from said first standard cell netlist and said second standard cell netlist.

12. The method of claim 8 further comprising:

performing verification of said first standard cell netlist and said second standard cell netlist.

13. A method of designing an integrated circuit containing standard cell and custom logic comprising:

designing a first portion of said integrated circuit using HDL to produce a first HDL netlist;

designing a second portion of said integrated circuit using SPICE to produce a SPICE netlist;

synthesizing said first HDL netlist to produce a first standard cell netlist;

converting said SPICE netlist to a second HDL netlist;

synthesizing said second HDL netlist to produce a second standard cell netlist;

extracting timing paths from said SPICE netlist;

simulating said SPICE netlist;

extracting timing information from the SPICE simulation; and creating a standard delay file using said timing information such that when said delay file is applied to said standard cells in said second standard cell netlist, standard cell timing reflects said timing information from said SPICE simulation.

14. The method of claim 13 wherein said first HDL netlist and said second HDL netlist are Verilog netlists.

15. The method of claim 13 further comprising:

simulating said first standard cell netlist and said second standard cell netlist.

16. The method of claim 13 further comprising:

extracting fault coverage information from said first standard cell netlist and said second standard cell netlist.

17. The method of claim 13 further comprising:

performing verification of said first standard cell netlist and said second standard cell netlist.

18. An integrated circuit produced by the steps of:

partitioning a design into a plurality of function blocks;

designing a first one of said plurality of function blocks employing an HDL to produce an HDL netlist;

synthesizing said HDL netlist to produce a first standard cell netlist;

designing a second one of said plurality of function blocks employing SPICE to produce a SPICE netlist;

simulating said SPICE netlist;

converting said SPICE netlist to logic functions;

selecting standard cells that correspond to said logic functions to produce a second standard cell netlist;

extracting timing paths from said SPICE netlist;

extracting timing information from the SPICE simulation; and creating a standard delay file using said timing information such that, when said delay file is applied to said standard cells in said second standard cell netlist, standard cell timing reflects said timing information from said SPICE simulation.

19. The integrated circuit of claim 18 wherein said HDL netlist is a Verilog netlist.

20. The integrated circuit of claim 18 further comprising:
performing verification of said first standard cell netlist and said second standard cell netlist.

21. The integrated circuit of claim 18 further comprising:
combining said first standard cell netlist and said second standard cell netlist and simulating the combined netlist.

22. The method of claim 21 further comprising:
extracting fault coverage information from said combined netlist.

23. An integrated circuit produced by the steps of:
partitioning a design into a plurality of function blocks;
designing a first one of said plurality of function blocks employing an HDL to produce a first HDL netlist;
synthesizing said first HDL netlist to produce a first standard cell netlist;
designing a second one of said plurality of function blocks employing SPICE to produce a SPICE netlist;
simulating said SPICE netlist;
converting said SPICE netlist to HDL to produce a second HDL netlist;
synthesizing said second HDL netlist to produce a second standard cell netlist;
extracting timing paths from said SPICE netlist;
extracting timing information from the SPICE simulation; and
creating a standard delay file using said timing information such that when said delay file is applied to said standard cells in said second standard cell netlist, standard cell timing reflects said timing information from said SPICE simulation.

24. The integrated circuit of claim 23 wherein said first HDL netlist and said second HDL netlist are Verilog netlists.

25. The integrated circuit of claim 23 further comprising:
performing verification of said first standard cell netlist and said second standard cell netlist.

26. The integrated circuit of claim 23 further comprising:
combining said first standard cell netlist and said second standard cell netlist and simulating the combined netlist.

27. The method of claim 26 further comprising:
extracting fault coverage information from said combined netlist.

28. A system for converting a SPICE netlist to a standard cell netlist comprising:
a computer;
a first program that converts said SPICE netlist to logic functions;
a second program that selects standard cells corresponding to said logic functions;
a third program that associates SPICE simulation timing information with signal paths of said standard cells and creates a standard delay file such that when said delay file is applied to said standard cells, timing of said standard cells reflects said SPICE simulation timing.

29. A system for converting a SPICE netlist to a standard cell netlist comprising:
a computer;
a first program that converts said SPICE netlist to logic functions;
a second program that employs SPICE simulation information to select standard cells for said logic functions that reflect timing information;
a third program that associates SPICE simulation timing information with signal paths of said standard cells and creates a standard delay file such that when said delay file is applied to said standard cells, timing of said standard cells reflects said SPICE simulation timing.

30. A system for converting a SPICE netlist to a standard cell netlist comprising:
a computer;
a first program that converts said SPICE netlist to an HDL netlist;
a second program that synthesizes said HDL netlist into a standard cell netlist comprising a plurality of standard cells; and
a third program that associates SPICE simulation timing information with signal paths of said standard cells and creates a standard delay file such that when said delay file is applied to said standard cells, timing of said standard cells reflects said SPICE simulation timing.

31. The system of claim 30 wherein said HDL netlist is a Verilog netlist.

* * * * *